United States Patent
Wadhwa et al.

(10) Patent No.: US 7,498,848 B2
(45) Date of Patent: Mar. 3, 2009

(54) SYSTEM AND METHOD FOR MONITORING CLOCK SIGNAL IN AN INTEGRATED CIRCUIT

(75) Inventors: Sanjay Kumar Wadhwa, Noida (IN); Amit Kumar Srivastava, Raebareli (IN)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 11/851,380

(22) Filed: Sep. 6, 2007

(65) Prior Publication Data

US 2008/0079463 A1   Apr. 3, 2008

(30) Foreign Application Priority Data

Oct. 3, 2006   (IN) .................. 2170/DEL/2006

(51) Int. Cl.
   *H03K 5/19*   (2006.01)
(52) U.S. Cl. .......................... 327/20; 327/18
(58) Field of Classification Search ............. 327/18–20, 327/24, 26, 142
   See application file for complete search history.

(56) References Cited

U.S. PATENT DOCUMENTS

| | | | |
|---|---|---|---|
| 4,311,962 A * | 1/1982 | Titsworth | 327/20 |
| 4,374,361 A | 2/1983 | Holden | |
| 4,633,097 A | 12/1986 | Dewitt | |
| 5,138,636 A * | 8/1992 | Bardin | 375/357 |
| 5,159,615 A * | 10/1992 | Clark | 377/56 |
| 6,008,671 A | 12/1999 | Kang | |
| 6,218,893 B1 * | 4/2001 | Noguchi | 327/540 |
| 6,246,261 B1 * | 6/2001 | Monceau | 326/46 |
| 6,545,508 B2 * | 4/2003 | Senba | 327/20 |
| 6,597,204 B2 * | 7/2003 | Imamura | 327/20 |
| 6,707,320 B2 * | 3/2004 | Trivedi et al. | 327/20 |
| 6,737,892 B2 * | 5/2004 | Jong et al. | 327/18 |
| 7,106,116 B2 * | 9/2006 | Yamada | 327/175 |
| 2007/0103204 A1 * | 5/2007 | Egan et al. | 327/100 |
| 2008/0001637 A1 * | 1/2008 | Chen et al. | 327/65 |
| 2008/0224753 A1 * | 9/2008 | Tsuji | 327/292 |

* cited by examiner

*Primary Examiner*—Donovan Lincoln
*Assistant Examiner*—Thomas J Hiltunen
(74) *Attorney, Agent, or Firm*—Charles Bergere

(57) ABSTRACT

A clock monitor system for monitoring an input clock signal in an integrated circuit (IC) includes a clock failure detection circuit and a delay circuit. The clock failure detection circuit generates a control signal based on the input clock signal. The delay circuit is connected to the clock failure detection circuit and provides a clock status signal based on the control signal. The clock status signal indicates whether the input clock signal is operating correctly. The delay circuit provides the clock status signal to the IC after a predetermined number of input clock cycles.

11 Claims, 9 Drawing Sheets

SYSTEM AND METHOD FOR MONITORING CLOCK SIGNAL IN AN INTEGRATED CIRCUIT

BACKGROUND OF THE INVENTION

The present invention relates generally to integrated circuits (ICs), and more specifically, to a method for monitoring an input clock signal to an IC.

ICs generally include several logic elements. Some logic elements require clocking for their operation. These elements work synchronously with each other. The synchronous operation of the elements requires an accurate clocking system. Typically, an input clock signal is provided to the IC and distributed among the elements requiring clocking.

The input clock signal switches alternately between two logic levels, i.e. a low logic level and a high logic level, during correct operation. Failure of the input clock signal occurs when the input clock signal does not switch from one logic level to another or when the input clock signal becomes unavailable. The input clock signal is not able to switch between the logic levels if it gets stuck at a particular logic level. The elements of an IC can malfunction due to failure of the input clock signal. To avoid malfunctioning of these elements, clock monitor systems are provided to monitor the input clock signal. These clock monitor systems provide a signal indicating the failure of the input clock signal to the IC.

Most clock monitor systems monitor the input clock signal by comparing it with a reference clock signal. The reference clock signal is generated using either an on-chip ring oscillator circuit or an external clock generator circuit. To monitor an input clock signal having a frequency range between 8 MHz and 40 MHz, it is essential that the reference clock signal generated by a reference clock generator circuit is less than 8 MHz. It is very complex to design a ring oscillator circuit of frequency less than 8 MHz considering process, voltage and temperature variations in an IC. Further, some wireless chips operate at a low frequency of 32.768 KHz. Designing a low frequency ring oscillator circuit requires great effort and increases the size of the IC. Therefore, including a reference clock signal in an IC leads to increased design time, complexity and system cost.

BRIEF DESCRIPTION OF THE DRAWINGS

The following detailed description of preferred embodiments of the present invention will be better understood when read in conjunction with the appended drawings. The present invention is illustrated by way of example and not limited by the accompanying figures, in which like references indicate similar elements.

DETAILED DESCRIPTION OF THE PRESENT INVENTION

The detailed description in connection with the appended drawings is intended as a description of the presently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a clock monitor system to monitor an input clock signal to an integrated circuit (IC) is provided. The clock monitor system includes a clock failure detection circuit and a delay circuit connected to the clock failure detection circuit. The clock failure detection circuit generates a control signal based on an input clock signal switching. The delay circuit provides a clock status signal to the IC based on the control signal. The clock status signal indicates whether operation of the input clock signal is correct. The delay circuit provides the clock status signal after a predetermined number of input clock cycles.

In another embodiment of the present invention, a method for monitoring an input clock signal to an integrated circuit (IC) is provided. The method includes generating a control signal based on an input clock signal switching. The control signal is generated to detect a failure of the input clock signal. Thereafter, a clock status signal is provided to the IC based on the control signal after a predetermined number of input clock cycles. The clock status signal indicates whether operation of the input clock signal is correct.

Embodiments of the present invention provide a system and method for monitoring the input clock signal in an IC. The present system and method do not use a reference clock signal to monitor the input clock signal. The system is both simple and robust. In the case of correct operation of the input clock signal after a failure condition, the correct operation of the input clock signal is indicated to the IC after a predetermined number of input clock cycles. Further, the system uses enhancement mode transistors. The use of enhancement mode transistors allows the clock monitor system to be easily integrated with current CMOS process technologies.

Figure 1:
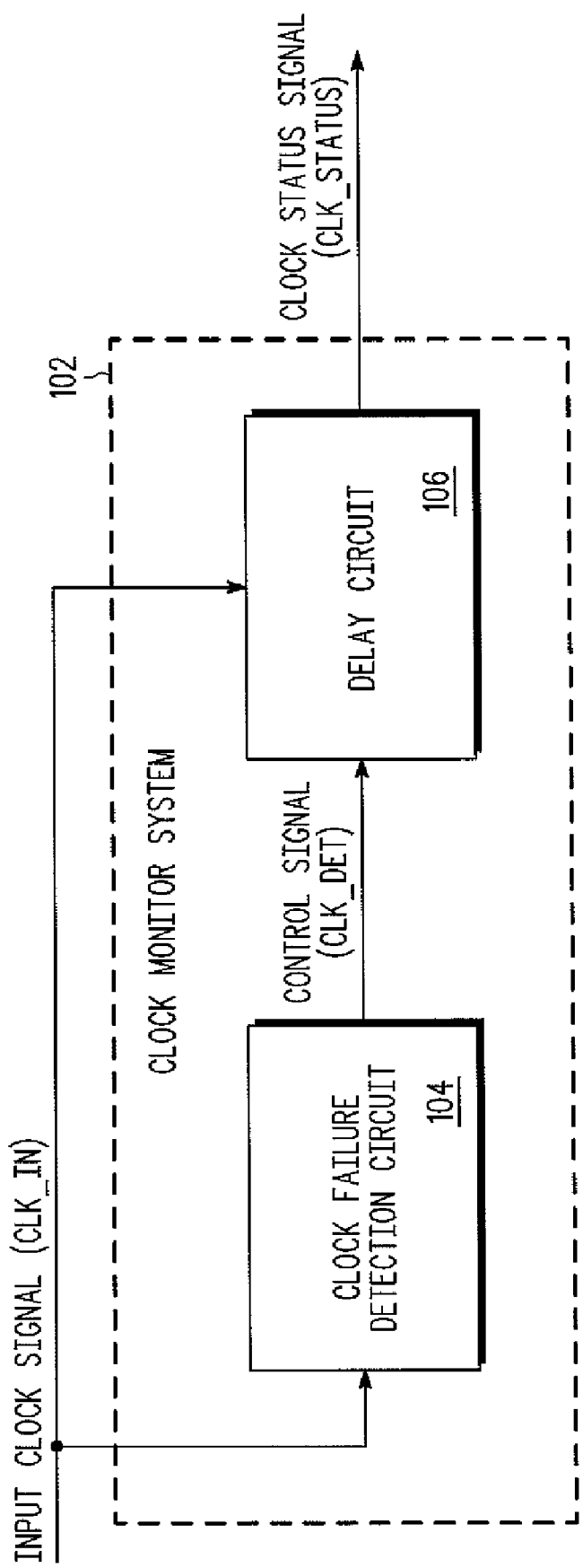
FIG. 1 is a schematic block diagram of a clock monitor system in accordance with an embodiment of the present invention.

Referring now to FIG. 1, a schematic block diagram of a clock monitor system 102, in accordance with an embodiment of the present invention, is shown. The clock monitor system 102 includes a clock failure detection circuit 104 and a delay circuit 106. An input clock signal (clk_in) is provided to the clock failure detection circuit 104 and the delay circuit 106. The input clock signal switches alternately between a first logic level and a second logic level. Typically, for the correct operation of the input clock signal, the clock signal stays at the first logic level for a time interval of T/2, where T is the time period of the input clock signal. The input clock signal then switches to the second logic level and stays at this level for a time interval of T/2. It will be apparent to a person skilled in the art that the time for which the input clock signal can stay at the first logic level or second logic level can be a period different than T/2 when the duty cycle of the input clock signal is other than 50 percent. In an embodiment of the present invention, the input clock signal fails to operate properly when it gets stuck either at the first logic level or at the second logic level for a period other than T/2 when the duty cycle is 50 percent.

The clock failure detection circuit 104 generates a control signal (clk_det) based on the input clock signal switching. The operation of the clock failure detection circuit 104 is explained further in conjunction with FIGS. 2 and 3. The delay circuit 106 provides a clock status signal (clk_status) to the IC based on the control signal. The clock status signal indicates whether the operation of the input clock signal is correct. The delay circuit 106 generates the clock status signal after a predetermined number of input clock cycles. The operation of the delay circuit 106 is explained further in conjunction with FIG. 4.

Figure 2:
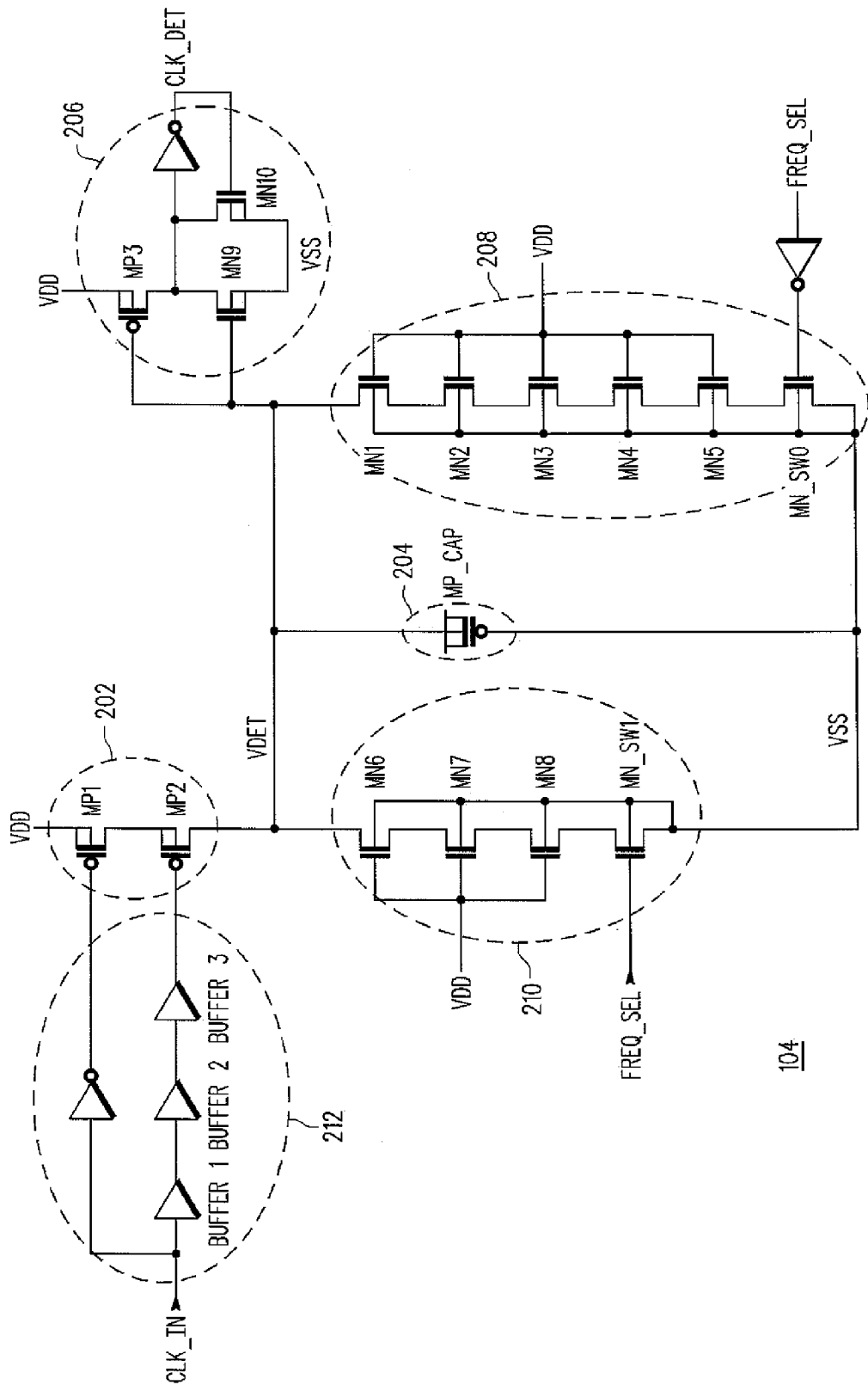
FIG. 2 is a schematic circuit diagram of a clock failure detection circuit of the clock monitor system of FIG. 1 in accordance with an embodiment of the present invention.

Referring now to FIG. 2, a schematic circuit diagram of the clock failure detection circuit 104 in accordance with an exemplary embodiment of the present invention is shown. The clock failure detection circuit 104 includes a plurality of transistors 202, an energy storage element 204, an output circuit 206, a first discharge path 208, a second discharge path 210 and one or more delay elements 212. The input clock signal (clk_in) is applied to the plurality of transistors 202 through the one or more delay elements 212. The plurality of transistors 202 includes a first PMOS transistor (MP1) and a second PMOS transistor (MP2). The transistors MP1 and MP2 are connected to a power supply Vdd. The energy storage element 204 is connected to the plurality of transistors 202. In one embodiment, the energy storage element 204 is a capacitor (MP_CAP), which charges toward Vdd when both the transistors MP1 and MP2 are in an ON state. The energy storage element 204 discharges through one of the first and second discharge paths 208 and 210 when at least one transistor of the plurality of transistors 202 is in an OFF state. The first discharge path 208 includes transistors MN1, MN2, MN3, MN4, MN5 and MN_SW0. The second discharge path 210 includes transistors MN6, MN7, MN8 and MN_SW1. The resistance of the first discharge path 208 and the second discharge path 210 can differ depending upon the number of transistors in the respective discharge paths. It will be apparent to a person skilled in art that the first discharge path 208 and the second discharge path 210 can also include resistances. In this embodiment of the present invention, the first and second discharge paths 208 and 210 are connected in parallel to the energy storage element 204.

The output circuit 206 includes a PMOS transistor MP3, NMOS transistors MN9 and MN10, and an inverter. The output circuit 206 operates based on the voltages at the gates of the transistors MP3 and MN9. The gates of the transistors MP3 and MN9 are connected to the energy storage element 204. The control signal (clk_det) generated by the output circuit 206 depends on the voltage level at the energy storage element 204. During the correct operation of the input clock signal, the energy storage element 204 charges and discharges during each clock cycle of the input clock signal such that voltage at the energy storage element 204 remains above a threshold voltage of transistor MN9 of the output circuit 206. This ensures that during the correct operation of the input clock signal the transistor MN9 remains switched ON and the transistor MP3 remains switched OFF, and the control signal remains at a HIGH logic level.

One of the first and second discharge paths 208, 210 is selected for discharging the energy storage element 204 based on an input signal freq_sel that is applied to the transistors MN_SW0 and MN_SW1. The logic level of the input signal freq_sel is selected based on the operating frequency of the input clock signal. In one embodiment of the present invention, a HIGH logic value is applied to the freq_sel signal when the operating frequency of the input clock signal is high. The high frequency range of the input clock signal is from about 8 MHz to about 40 MHz. In this embodiment, the second discharge path 210 is selected for discharging the energy storage element 204. In another embodiment of the present invention, a LOW logic value is applied to the freq_sel signal when the operating frequency of the input clock signal is low. The input clock signal low frequency is about 32.768 KHz. In this embodiment, the first discharge path 208 is selected for discharging the energy storage element 204. Hence, the higher the operating frequency of the input clock signal, a discharge path with less series transistors is selected for discharging the energy storage element 204. It will be apparent to a person skilled in the art that the plurality of transistors 202 also can include NMOS transistors instead of PMOS transistors. Similarly, the first and second discharge paths 208 and 210 also can include PMOS transistors instead of NMOS transistors. In another embodiment, the first and second discharge paths 208 and 210 are implemented using resistors. The operation of the clock failure detection circuit 104 is explained further in conjunction with FIGS. 3 and 4.

Figure 3:
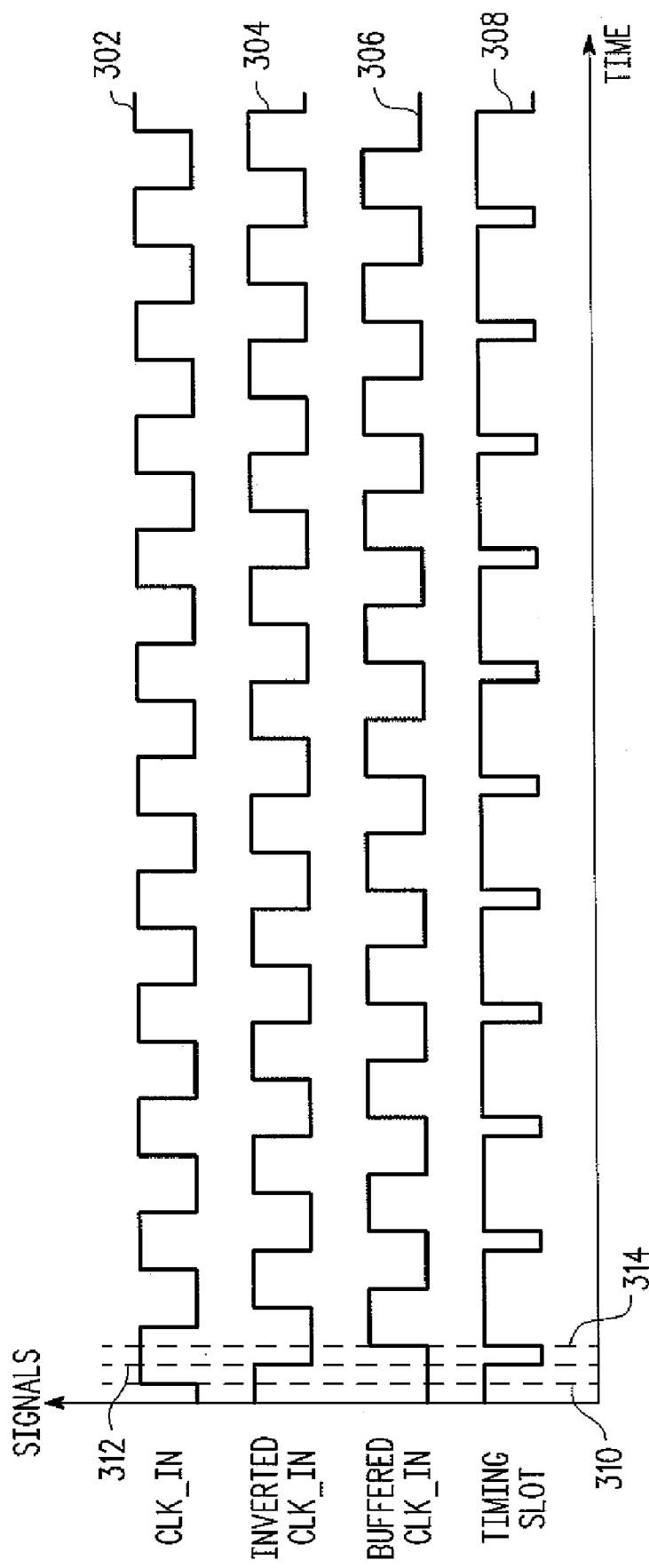
FIG. 3 is a pulse waveform illustrating the switching operation of transistors of the clock failure detection circuit of FIG. 2.

Referring now to FIG. 3, a pulse waveform representation illustrating the switching operation of transistors used in the clock failure detection circuit 104, in accordance with an embodiment of the present invention, is shown. FIG. 3 shows a clk_in pulse 302, an inverted clk_in pulse 304, a buffered clk_in pulse 306 and a timing slot signal 308. The clk_in pulse 302 represents the correct operation of the input clock signal. The inverted clk_in pulse 304 represents the input clock signal at the gate of the transistor MP1. The buffered clk_in pulse 306 represents the input clock signal at the gate of the transistor MP2. The clk_in pulse 302 is applied to the transistor MP1 through an inverter as shown in FIG. 2. Therefore, the inverted clk_in pulse 304 is inverted and shifted with respect to the clk_in pulse 302. Shifting of the inverted clk_in pulse 304 with respect to the clk_in pulse 302 is due to the propagation delay of the inverter. The clk_in pulse 302 is applied to the transistor MP2 through the delay elements 212 (buffer1, buffer2 and buffer3). The three buffers 1, 2 and 3 introduce a delay in the clk_in pulse 302 at the gate of the transistor MP2. Therefore, the buffered clk_in pulse 306 is a shifted version of the clk_in pulse 302.

The charging and discharging of the energy storage element 204 can be explained with the help of the timing slot pulse 308. The timing slot pulse 308 shows the charging and discharging time intervals of the energy storage element 204. The clk_in pulse 302 switches to the first logic level, i.e., a HIGH logic level at a time indicated at 310. At the time 310, the inverted clk_in pulse 304 is at the first logic level and the buffered clk_in pulse 306 is at the second logic level, i.e. at the LOW logic level. Therefore, at the time 310, transistor MP1 is in an OFF state and transistor MP2 is in an ON state. Hence, there is no path for the energy storage element 204 to be charged toward the voltage Vdd. At a time 312, the clk_in pulse 302 is at the first logic level and the inverted clk_in pulse 304 switches to the second logic level. Hence both the transistors MP1 and MP2 turn ON. The buffered clk_in pulse 306 remains at the second logic level at the time 312. Since transistor MP2 is ON at the time 312, a path is established that charges the energy storage element 204 toward Vdd. At a time 314, the inverted clk_in pulse 304 is at the second logic level, causing transistor MP1 to remain ON. The buffered clk_in pulse 306 switches to the first logic level at the time 314, turning transistor MP2 to the OFF state. The energy storage element 204 begins discharging through either the first discharge path 208 or the second discharge path 210, depending on the value of the freq_sel signal. Thus, the energy storage element 204 charges and discharges in each cycle of the clk_in pulse 302. If failure of the input clock signal is due to the clk_in pulse 302 being stuck at the second logic level, transistor MP1 remains OFF for the duration of time for which the clk_in pulse is stuck. Similarly, transistor MP2 remains OFF for the duration of time for which the clk_in pulse 302 is stuck at the first logic level. Therefore, there is no path through which the energy storage element 204 can charge when the input clock signal is stuck either at the first logic level or the second logic level.

For example, the energy storage element 204 charges towards a first logic level during the correct operation of the input clock signal, that is, when both the transistors MP1 and MP2 are in ON state. Further, the energy storage element 204 discharges towards the second logic level when either of the transistors MP1 and MP2 is OFF during the correct operation of the input clock signal. Thus, the energy storage element 204 detects whether the input clock signal is operating correctly. The output circuit 206 generates the control signal based on the voltage level at the energy storage element 204. When the voltage level at the energy storage element 204 is greater than the threshold voltage, the transistor MN9 is in the ON state. Hence, the control signal (clk_det) is at a HIGH voltage level. In an embodiment of the present invention, the voltage level at the energy storage element 204 is maintained above the threshold voltage when the input clock signal operates correctly, which causes a HIGH logic level at the clk_det signal. In this case, the high logic level at the clk_det signal represents the correct operation of the input clock signal. In the same embodiment, the energy storage element 204 discharges to a voltage level that is less than the threshold voltage when the input clock signal does not operate correctly. In this case, the transistor MN9 turns OFF and the control signal (clk_det) switches to a LOW voltage level, which indicates that the input clock signal is stuck at either the first logic level or the second logic level.

Figure 4:
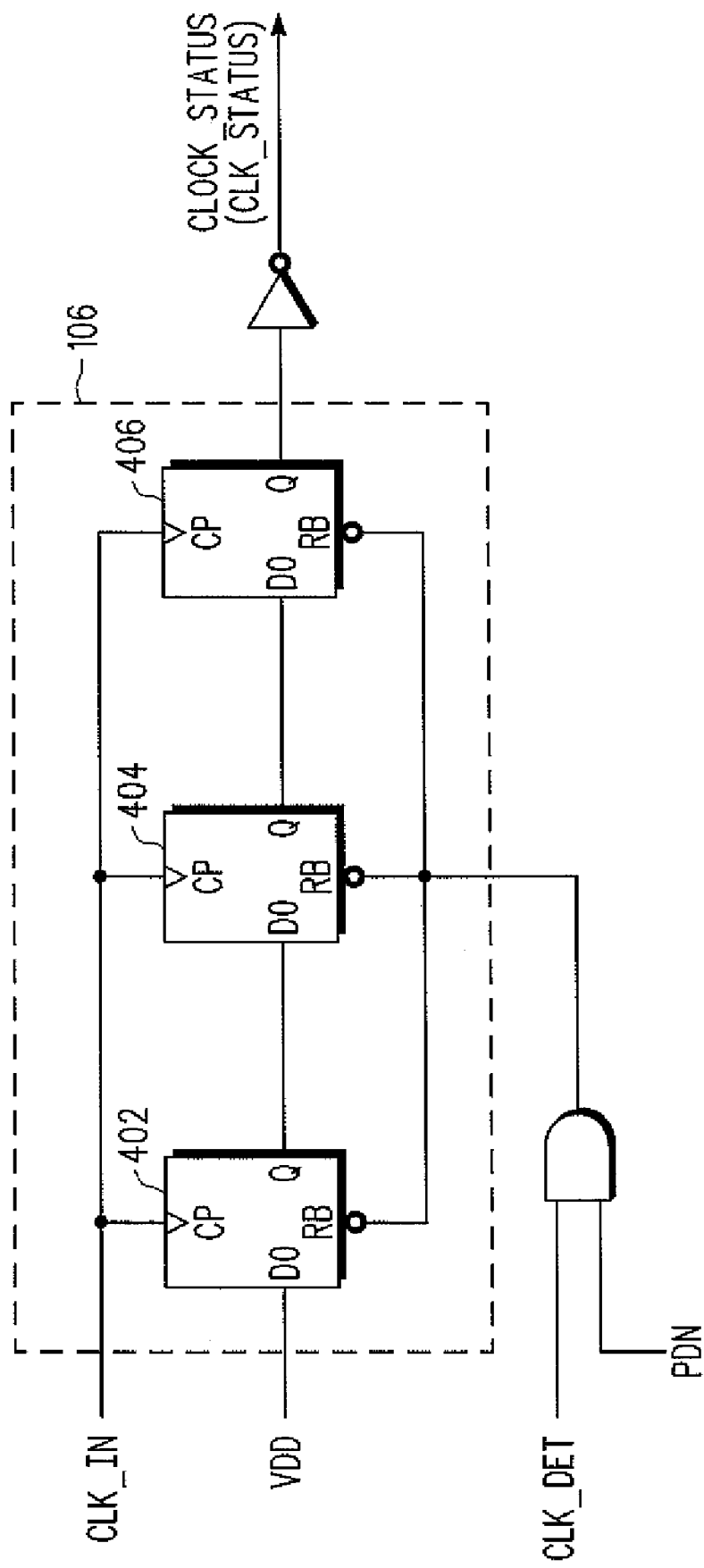
FIG. 4 is a schematic diagram of a delay circuit of FIG. 1 in accordance with an embodiment of the present invention.

Referring now to FIG. 4, a schematic block diagram of an embodiment of the delay circuit 106 is shown. The delay circuit 106 includes a first, second and third D flip-flops 402, 404 and 406. As shown in FIG. 1, the delay circuit 106 is connected to the clock failure detection circuit 104. The control signal (clk_det) generated by the clock failure detection circuit 104 is ANDed with a pdn signal and then input to the reset pins of the first, second and third D flip-flops 402, 404 and 406. The pdn signal controls the power supply in the integrated circuit. The clock failure detection circuit 104 and the delay circuit 106 are triggered when the pdn signal is at a LOW logic level. The delay circuit 106 generates a clock status signal (clk_status) in response to the input clock signal and the control signal. In an embodiment of the present invention, the delay circuit 106 generates the clk_status signal with a LOW logic level when the input clock signal operates correctly. In this case, the first D flip-flop 402 passes the HIGH logic value Vdd to the input of the second D flip-flop 404, which, in turn, passes the HIGH logic value Vdd to the third D flip-flop 406, and consequently the clk_status signal has a LOW logic level.

When the input clock signal does not operate correctly, the control signal (clk_det) provided by the clock failure detection circuit 104 has a LOW logic value, which, in turn, resets the first, second and third D flip-flops 402, 404 and 406. In this case, the generated clk_status signal has a HIGH logic level. In the exemplary embodiment shown, the HIGH logic clk_status signal represents the failure of the input clock signal. Conversely, the LOW clk_status signal represents the correct operation of the input clock signal. The delay circuit 106 provides the clk_status signal to the IC after a pre-determined number of input clock cycles. The number of clock cycles in the predetermined number of input clock cycles depends on the number of flip-flops serially connected in the delay circuit 106. It will be understood by those skilled in the art that the delay circuit 106 can be formed with similar logic elements. For example, the D flip-flops can be replaced by other types of flip-flops, such as the SR flip-flop, the JK flip-flop, the T flip-flops and master slave flip-flops. In another embodiment of the present invention, the clk_det signal can be connected to the reset pin of the flip-flops 402, 404 and 406 such that a HIGH clk_det signal can reset the flip-flops 402, 404 and 406.

Figure 5:
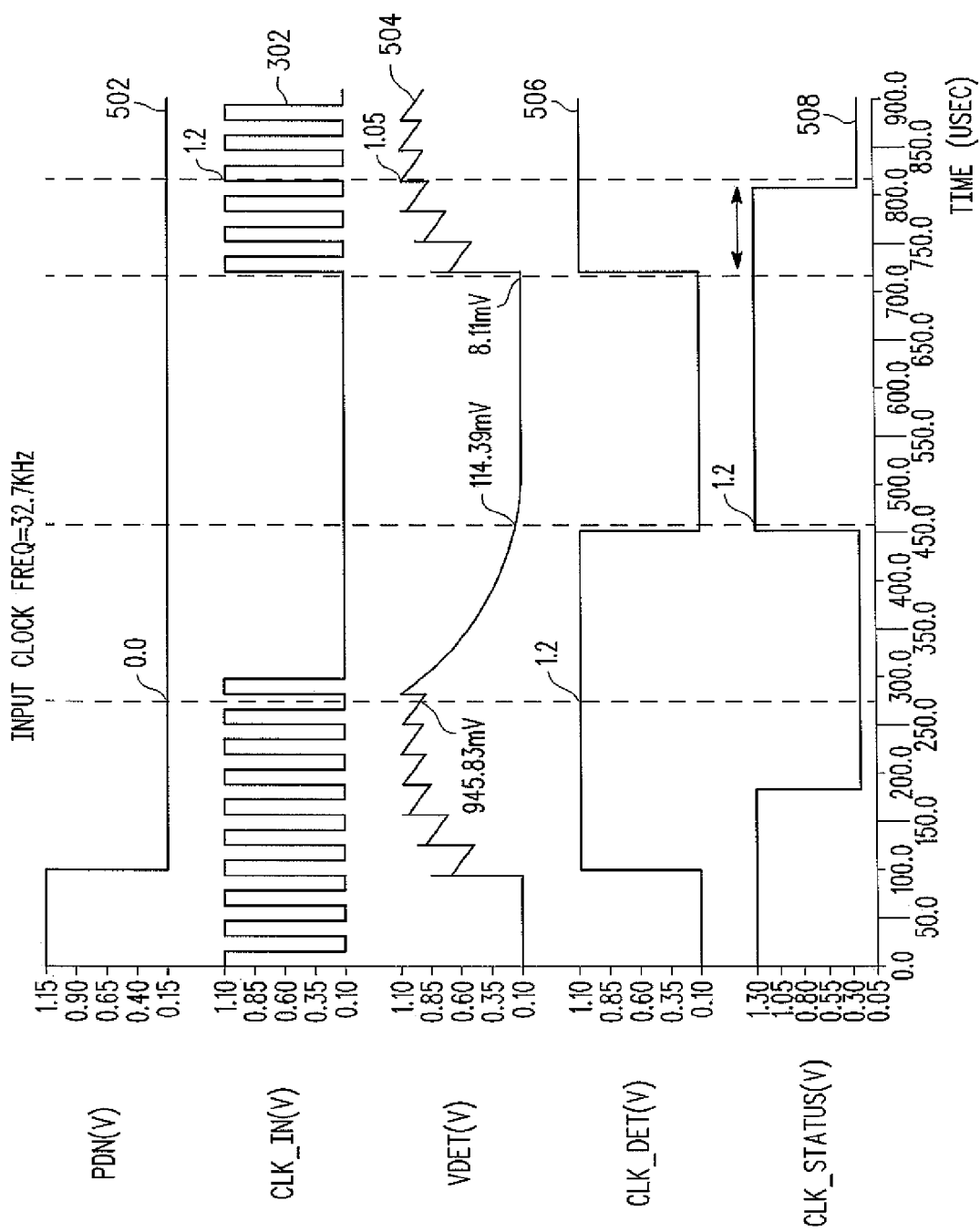
FIG. 5 is a waveform diagram illustrating the operation of the clock monitor system of FIG. 1 when the input clock signal frequency is 32.7 KHz and the input clock signal is stuck at a second logic level.

Referring to FIG. 5, a waveform diagram illustrating the operation of the clock monitor system 102 when the input clock signal frequency is 32.7 KHz and the input clock signal is stuck at the second logic level. The waveform diagram shows voltage (Y-axis) versus time (X-axis). Waveforms are shown for a pdn signal 502, the clk_in pulse 302, a Vdet signal 504, the clk_det pulse 506 and a clk_status pulse 508. In this case the freq_sel signal (input to the first and second discharge paths 208 and 210) has a LOW logic level, which causes the energy storage element 204 to discharge via the first discharge path 208. The pdn signal 502 represents a signal for controlling the power supply in the integrated circuit. The clock failure detection circuit 104 and the delay circuit 106 are triggered when the pdn signal is at a LOW logic level. As shown in FIG. 5, the clk_status signal has a HIGH logic level when the pdn signal 502 has a HIGH logic level. The Vdet signal 504 represents the voltage level at the energy storage element 204. The clk_det pulse 506 represents the control signal generated by the clock failure detection circuit 104. The clk_status pulse 508 shows the clock status signal generated by the delay circuit 106.

In FIG. 5, the clk_status pulse 508 is provided after three clock cycles of the input clock signal based on the clk_det pulse 506. After the pdn signal 502 goes LOW at about 100 μsec, the clock failure detection circuit 104 begins operation and the Vdet signal 504 increases to a value that is greater than the threshold voltage of transistor MN9. Consequently, the clk_det pulse 506 rises to a HIGH logic level at the time 100 μsec. The energy storage element 204 continues to charge and discharge as the clk_in pulse 302 switches alternately between the first logic level and the second logic level. In this embodiment, the voltage at the energy storage element 204 (Vdet) continues to increase as the input clock signal operates correctly. The clk_det pulse 506 remains at the HIGH logic level during the correct operation of the input clock signal. Beginning at the time 100 μsec, the clk_status pulse 508 goes to a LOW logic level after three clock cycles of the clk_in pulse 302. When Vdet reaches a voltage level of about 945.83 mV, the clk_in pulse 302 gets stuck at the second logic level and the clock failure condition occurs, at about 300.0 μsec. Thereafter, the energy storage element 204 begins discharging and Vdet starts decreasing. In this exemplary embodiment of the present invention, the threshold voltage is 114.39 mV.

The clock failure detection circuit 104 provides a LOW clk_det signal when the Vdet drops below 114.39 mV. This is shown by a LOW logic level in the clk_det pulse 506, at time 450.0 μsec. Further, the clk_det signal resets the first, second and third D flip-flops 402, 404 and 406 simultaneously, and a clk_status signal of a HIGH logic level is generated. This is represented by a HIGH logic level in the clk_status pulse 508 at the time 450.0 μsec. The input clock signal resumes correct operation at the time 715.0 μsec. The clk_in pulse 302 starts switching alternately at the time 715.0 μsec. Similarly, the Vdet signal 504 goes HIGH at the time 715.0 μsec, and the Vdet signal 504 starts rising. The correct operation of the clk_in pulse 302 after the time 715.0 μsec is indicated to the IC by the clk_status signal after three cycles of the input clock signal. This is shown by the LOW logic level of the clk_status pulse 508 at the time 820.0 μsec.

Figure 6:
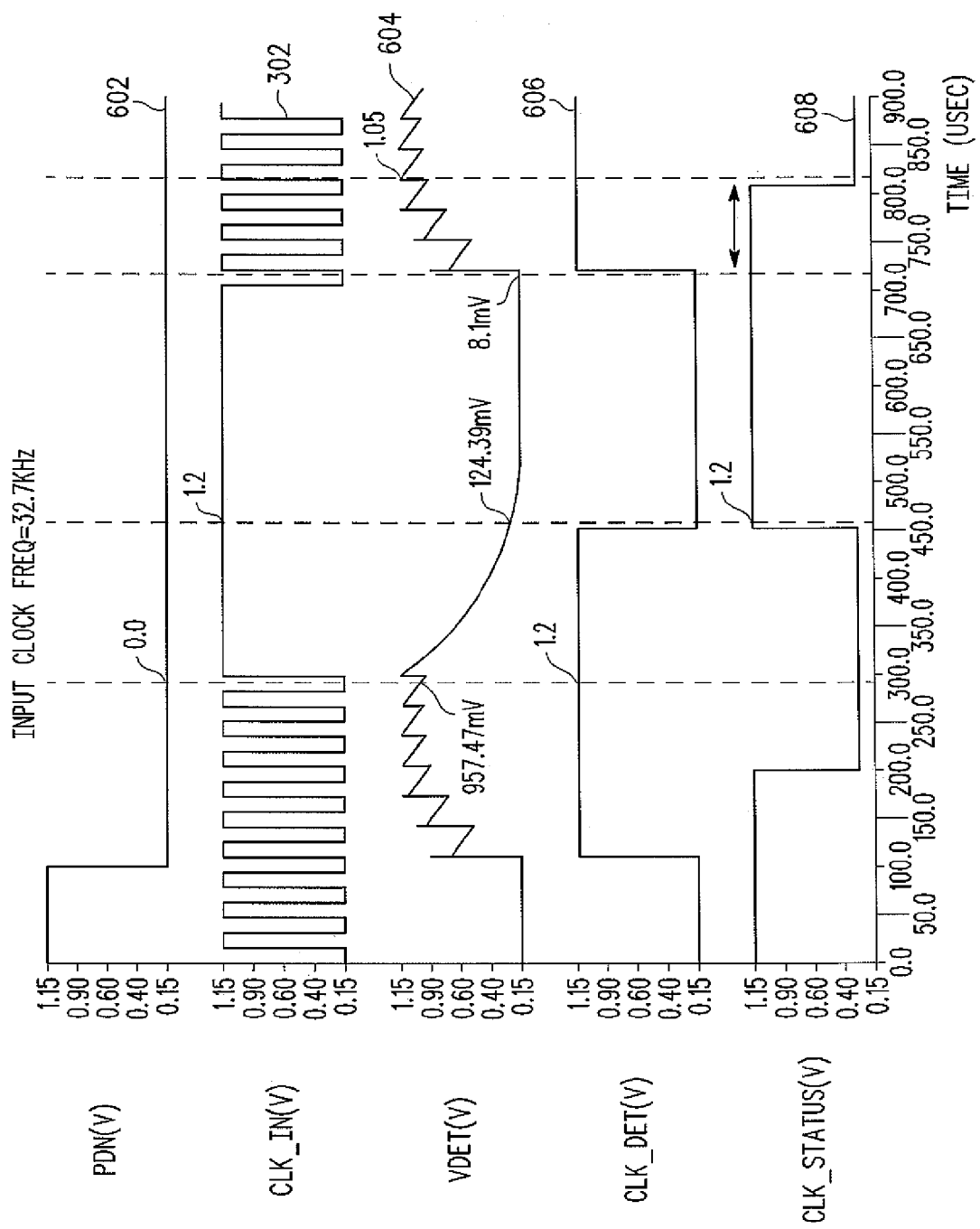
FIG. 6 is a waveform diagram illustrating the operation of the clock monitor system of FIG. 1 when the input clock signal frequency is 32.7 KHz and the input clock signal is stuck at a first logic level.

Referring to FIG. 6, a waveform diagram showing the operation of the clock monitor system when input clock signal frequency is 32.7 KHz and the input clock signal is stuck at a first logic level, in accordance with the present invention, is shown. The waveform diagram shows voltage (Y-axis) versus time (X-axis), and includes a pdn signal 602, a clk_in pulse 302, a Vdet signal 604, a clk_det pulse 606 and a clk_status pulse 608. In this case the freq_sel signal has a LOW logic level and the energy storage element 204 discharges through the first discharge path 208. The pdn signal 602 represents the power supply down control signal in an IC. The clk_status signal has a HIGH logic level when the pdn signal is HIGH. The Vdet signal 604 represents the voltage level at the energy storage element 204. The clk_det pulse 606 represents the control signal (clk_det) generated by the clock failure detection circuit 104. After the pdn signal 602 goes to a LOW logic level at a time 100 μsec, the clock failure detection circuit 104 begins operation and the Vdet signal 604 increases to a value that is greater than the threshold voltage of transistor MN9. Consequently, the clk_det pulse 606 rises to a HIGH logic level at the time 100 μsec. The energy storage element 204 continues charging and discharging as the clk_in pulse 302 switches alternately between the first logic level and the second logic level. In this embodiment, the voltage at the energy storage element 204 (Vdet) increases when the input clock signal is operating correctly. The clk_det pulse 606 remains at the HIGH logic level during the correct operation of the input clock signal.

Beginning at the time 100 μsec, the clk_status pulse 608 goes to a LOW logic level after three clock cycles of the clk_in pulse 302. When the Vdet reaches a voltage level of about 957.47 mV, the clk_in pulse 302 gets stuck at the first logic level and the clock failure condition occurs, at a time 300 μsec. Thereafter, the energy storage element 204 starts discharging and Vdet starts decreasing. If the threshold voltage level in this exemplary embodiment of the present invention is 124.39 mV, then the clock failure detection circuit 104 provides a LOW clk_det signal when the Vdet drops below 124.39 mV, as shown by a LOW logic level in the clk_det pulse 606 at time 465.0 μsec. Further, the clk_det signal resets the first, second and third D flip-flops 402, 404 and 406 simultaneously, and a clk_status signal of a HIGH logic level is generated. This is represented by a HIGH logic level in the clk_status pulse 608 at the time 465.0 μsec. The input clock signal resumes correct operation at the time 720.0 μsec, and the clk_in pulse 302 starts switching at the time 720.0 μsec. In addition, the Vdet signal 604 exceeds the threshold voltage level of transistor MN9 and the clk_det pulse 606 goes HIGH. The correct operation of the clk_in pulse 302 after the time 720 μsec is indicated to the IC by the clk_status signal, after three cycles of the input clock signal. This is shown by the LOW logic level of the clk_status pulse 608 at time 830.0 μsec.

Figure 7:
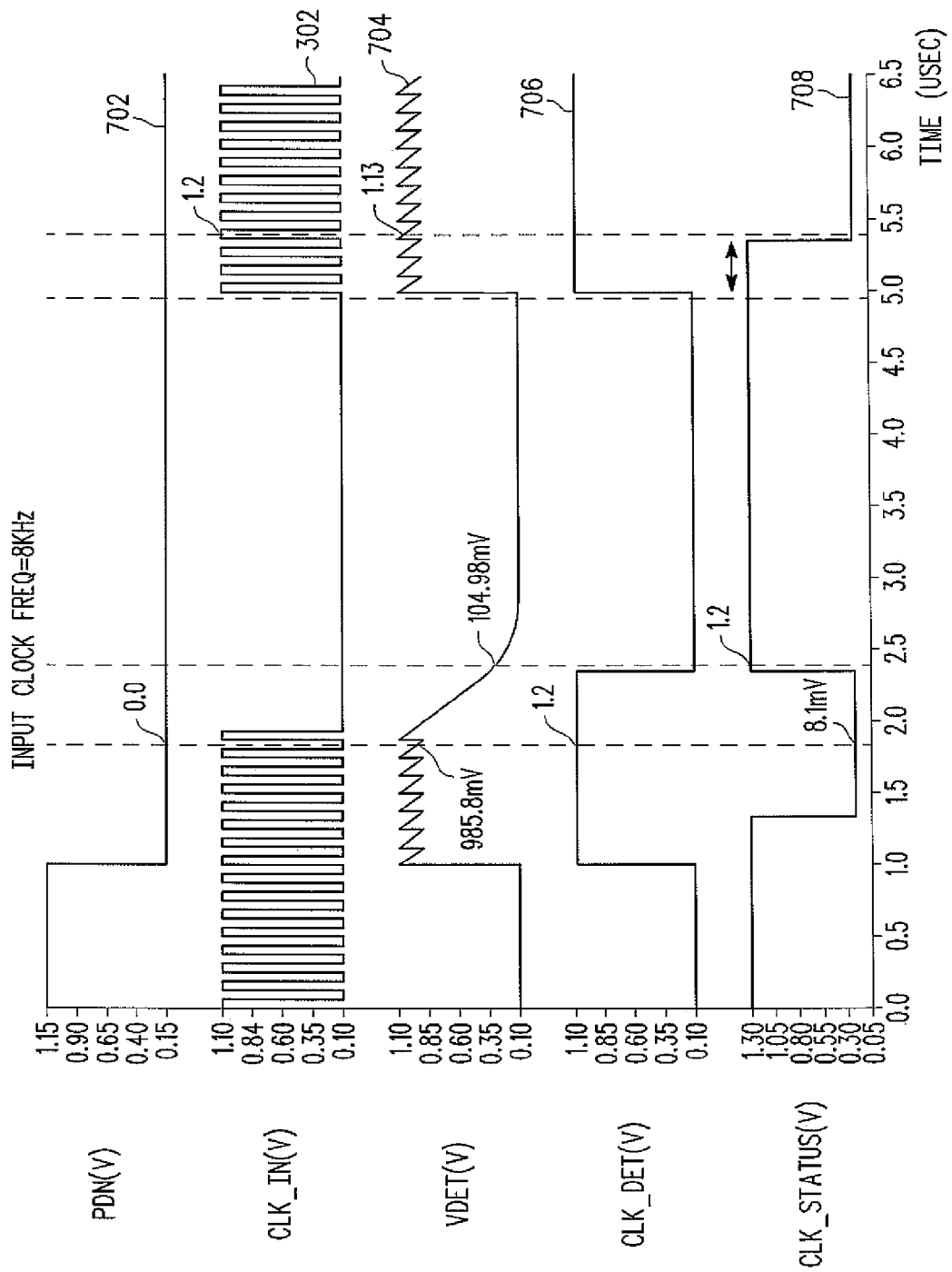
FIG. 7 is a waveform diagram illustrating the operation of the clock monitor system of FIG. 1 when the input clock signal frequency is 8 MHz and the input clock signal is stuck at a second logic level.

Referring to FIG. 7, a waveform diagram showing the operation of the clock monitor system when input clock signal frequency is 8 MHz and the input clock signal is stuck at a second logic level, in accordance with the present invention, is shown. The waveform diagram shows voltage (Y-axis) versus time (X-axis). FIG. 7 includes a pdn signal 702, a clk_in pulse 302, a Vdet signal 704, a clk_det pulse 706 and a clk_status pulse 708. In this case, the freq_sel signal is of HIGH logic level and the energy storage element 204 discharges via the second discharge path 210. The pdn signal 702 represents the control signal for controlling power in the IC. The clk_status signal is HIGH when the pdn signal is HIGH. The Vdet signal 704 represents the voltage level at the energy storage element 204. The clk_det pulse 706 represents the control signal (clk_det) generated by the clock failure detection circuit 104.

After the pdn signal 702 goes to a LOW logic level at the time of 1 μsec, the clock failure detection circuit 104 begins operation. The Vdet signal 704 exceeds the threshold voltage of transistor MN9 and consequently the clk_det pulse 706 rises to a HIGH logic level at the time 1 μsec. The energy storage element 204 continues to charge and discharge as the clk_in pulse 302 switches between the first logic level and the second logic level. The clk_det pulse 706 remains at the HIGH logic level during the correct operation of the input clock signal. From the time 1 μsec, the clk_status pulse 708 switches to a LOW logic level after three clock cycles of the clk_in pulse 302. When the Vdet is at a voltage level of 985.8 mV, the clk_in pulse 302 gets stuck at the second logic level and the clock failure condition occurs, at a time 1.8 μsec. Thereafter, the energy storage element 204 starts discharging and Vdet starts decreasing. If the threshold voltage level in this embodiment is 104.98 mV, then the clock failure detection circuit 104 provides a LOW clk_det signal when the Vdet drops below 104.98 mV. This is shown by a LOW logic level in the clk_det pulse 706, at time 2.4 μsec. Further, the clk_det signal resets the first, second and third D flip-flops 402, 404 and 406 simultaneously and a clk_status signal of a HIGH logic level is generated. This is represented by a HIGH logic level in the clk_status pulse 708 at the time 2.4 μsec. When the input clock signal resumes correct operation, at the time 5.0 μsec, the clk_in pulse 302 starts switching at the time 5.0 μsec. At the time 5.0 μsec, the Vdet signal 704 exceeds the threshold voltage of transistor MN9 and the clk_det pulse 706 goes HIGH. The correct operation of the clk_in pulse 302 after the time 5.0 μsec is indicated to the IC by the clk_status signal after three cycles of the input clock signal. This is shown by the LOW logic level of the clk_status pulse 710 at time 5.4 μsec.

Figure 8:
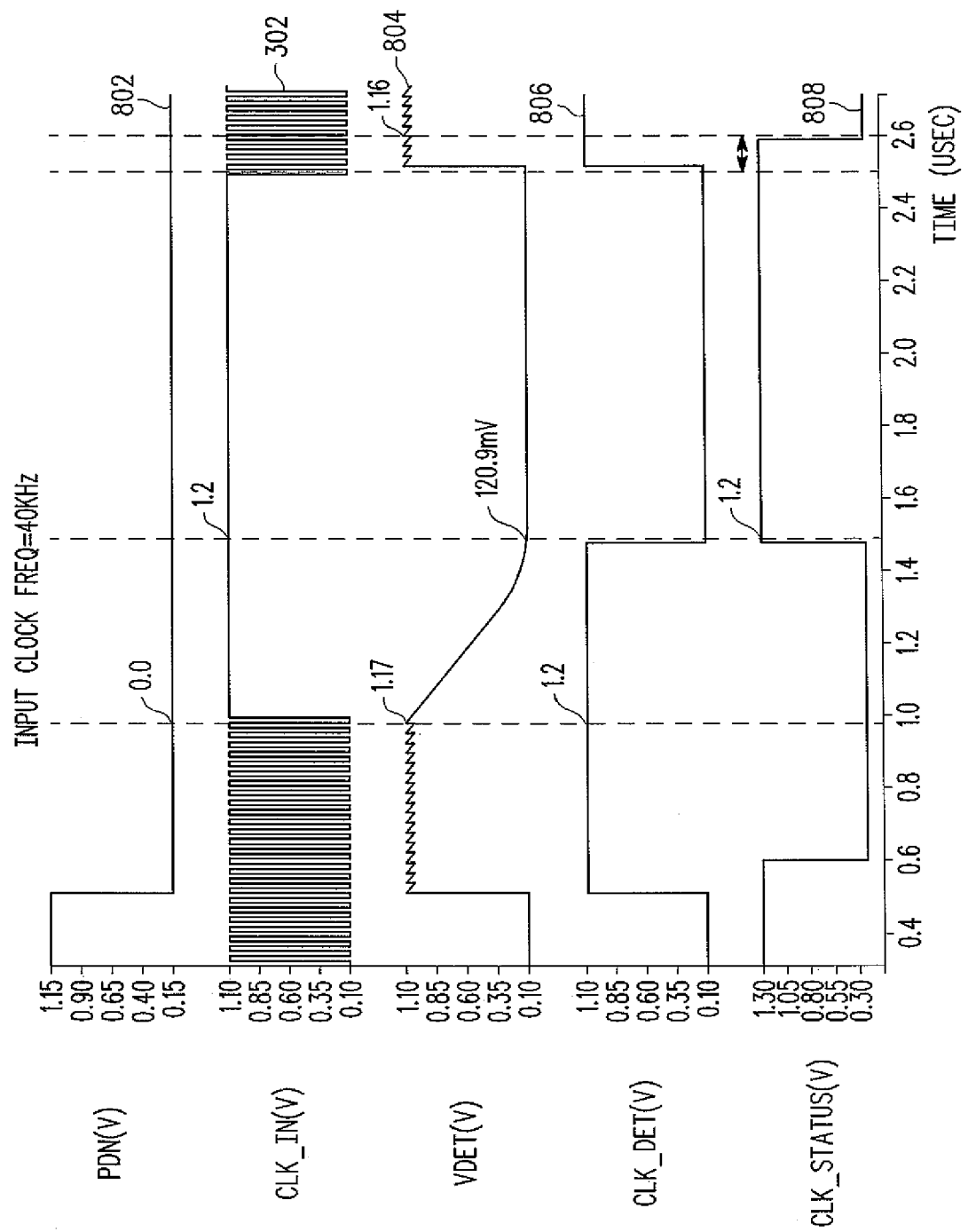
FIG. 8 is a waveform diagram illustrating the operation of the clock monitor system of FIG. 1 when the input clock signal frequency is 40 MHz and the input clock signal is stuck at a first logic level.

Referring to FIG. 8, a waveform diagram showing the operation of the clock monitor system when the input clock signal frequency is 40 MHz and the input clock signal is stuck at a first logic level, in accordance with the present invention, is shown. The waveform diagram shows voltage (Y-axis) versus time (X-axis). FIG. 8 includes a pdn signal 802, a clk_in pulse 302, a Vdet signal 804, a clk_det pulse 806 and a clk_status pulse 808. In this case, the freq_sel signal is of HIGH logic level and the energy storage element 204 discharges via the second discharge path 210. The pdn signal 802 represents the power supply down condition in an IC. The clk_status signal is of HIGH logic level when the pdn signal is of HIGH logic level. The Vdet signal 804 represents the voltage level at the energy storage element 204. The clk_det pulse 806 represents the control signal (clk_det) generated by the clock failure detection circuit 104.

After the pdn signal 802 goes to a LOW logic level at the time of 0.6 μsec, the clock failure detection circuit 104 begins operation. The Vdet signal 804 exceeds the threshold voltage of transistor MN9 and consequently the clk_det pulse 806 rises to a HIGH logic level, at the time 0.6 μsec. The energy storage element 204 continues charging and discharging when the clk_in pulse 302 switches alternately between the first logic level and the second logic level. The clk_det pulse 806 remains at the HIGH logic level during the correct operation of the input clock signal. Beginning at the time 0.6 μsec, the clk_status pulse 808 switches to a LOW logic level after three clock cycles of the clk_in pulse 302. When the Vdet is at a voltage level of 1.17 V, the clk_in pulse 302 gets stuck at the second logic level and the clock failure condition occurs, at a time 1.0 μsec. Thereafter, the energy storage element 204 starts discharging and Vdet starts decreasing. In this exemplary embodiment of the present invention, the threshold voltage level is 120.90 mV. The clock failure detection circuit 104 provides a LOW clk_det signal when the Vdet drops below to the 120.90 mV. This is shown by a LOW logic level in the clk_det pulse 806, at time 1.5 μsec. Further, the clk_det signal resets the first, second and third D flip-flops 402, 404 and 406 simultaneously and a clk_status signal of a HIGH logic level is generated. This is represented by a HIGH logic level in the clk_status pulse 808 at the time 1.5 μsec. The input clock signal resumes its correct operation at the time 2.5 μsec. The clk_in pulse 302 starts switching at the time 2.5 μsec. After the time 2.5 μsec, the Vdet signal 804 exceeds the threshold voltage level and the clk_det pulse 806 turns into a HIGH logic level. The correct operation of the clk_in pulse 302 after the time 2.5 μsec is indicated to the IC, by the clk_status signal after three cycles of the input clock signal. This is shown by the LOW logic level of the clk_status pulse 808 at time 2.6 μsec. It will be understood by a person skilled in the art that a similar waveform diagram can be obtained when the input clock frequency is 40 MHz and the clock gets stuck at the second logic level.

Figure 9:
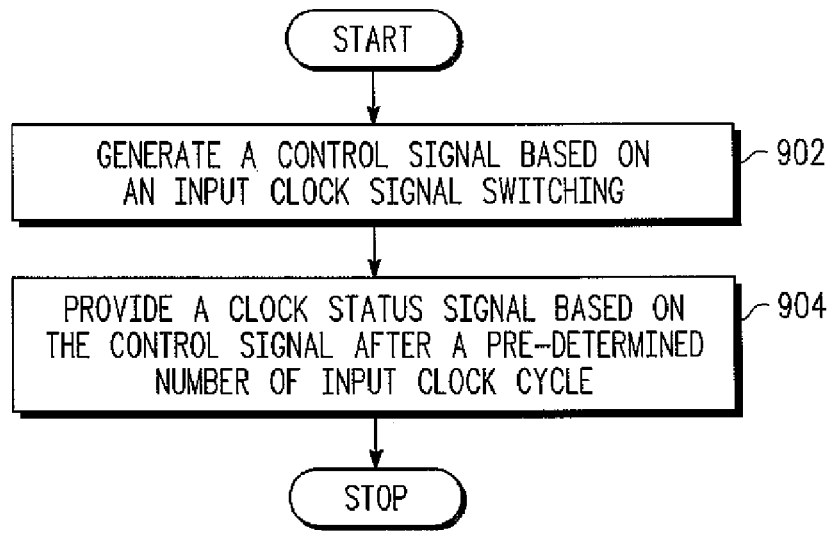
FIG. 9 is a flowchart depicting a method for monitoring an input clock signal to an IC in accordance with an embodiment of the present invention.

FIG. 9 is a flowchart depicting a method for monitoring an input clock signal to an integrated circuit (IC), in accordance with the present invention. At step 902, a control signal is generated based on an input clock signal switching. The input clock signal switches alternately between the first logic level and the second logic level during the correct operation. The clock failure condition in the input clock signal occurs when it stops switching and gets stuck at either the first logic level or the second logic level. In an embodiment of the present invention, the control signal of a HIGH logic level is generated when the input clock signal operates correctly, and of a LOW logic level is generated when there is a failure condition in the input clock signal. The method for generating the control signal is explained further in conjunction with FIG. 10.

Referring to FIG. 9, at step 904, a clock status signal is provided based on the control signal to the IC. The clock status signal indicates to the IC whether the input clock signal is operating correctly. In an embodiment of the present invention, the HIGH logic level of the clock status signal represents failure of the input clock signal and the LOW logic level of the clock status signal represents the correct operation of the input clock signal. In another embodiment of the present invention, the LOW logic level of the clock status signal represents the failure of the input clock signal and the HIGH logic level of the clock status signal represents the correct operation of the input clock signal. The clock status signal is generated as an output of one or more flip-flops. These one or more flip-flops are controlled by the control signal generated in step 902. The clock status signal is indicated to the IC after a pre-determined number of input clock cycles in response to the control signal provided at step 902. The number of flip-flops in the one or more flip-flops is selected based on the pre-determined number of input clock cycles.

Figure 10:
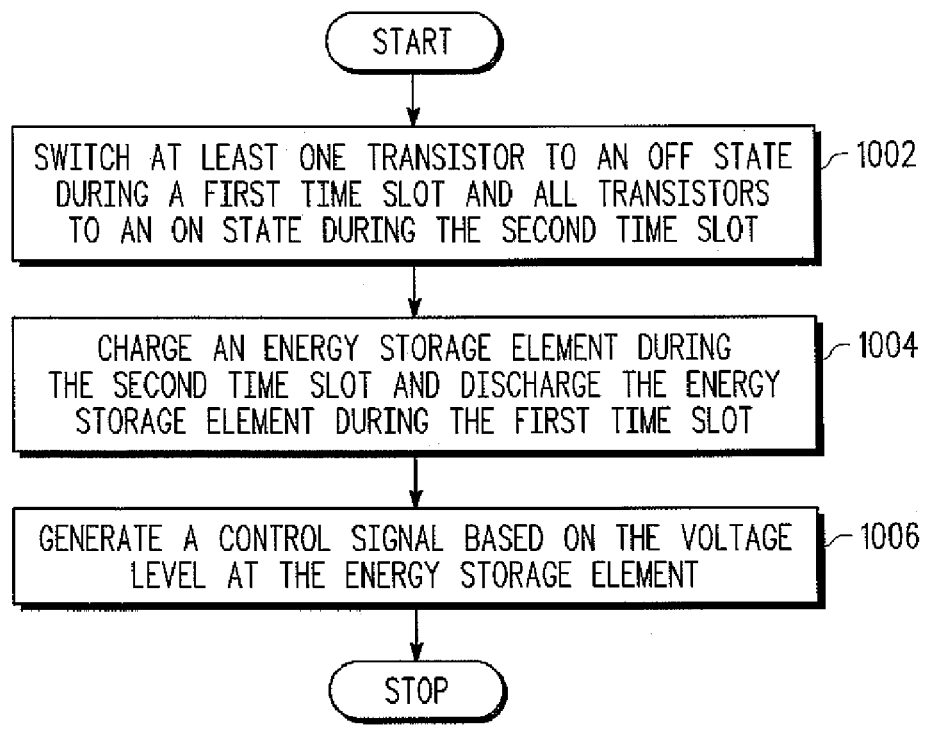
FIG. 10 is a flowchart depicting a method for generating a control signal in accordance with an embodiment of the present invention.

FIG. 10 is a flowchart depicting a method for providing the control signal in accordance with an embodiment of the present invention. At step 1002, at least one transistor of the plurality of transistors 202 is switched to an OFF state during a first time slot, and all of the transistors of the plurality of transistors 202 are switched to an ON state during the second time slot. During the correct operation of the input clock signal, this phenomenon repeats for each cycle of the input clock signal. If the input clock signal is not operating correctly, i.e., the failure condition of the input clock signal, at least one transistor of the plurality of transistors 202 remains in the OFF state until the input clock signal starts operating correctly. At step 1004, an energy storage element charges toward the Vdd through the plurality of transistors 202 during the second time slot and discharges during the first time slot. In one embodiment of the invention, the energy storage element is a capacitor. During the correct operation of the input clock signal, the capacitor keeps on charging and discharging in each cycle of the input clock signal. Therefore, the voltage level at the capacitor is always maintained above a threshold voltage. During the clock failure condition of the input clock signal, there is no charging phenomenon for the capacitor. Thereby, the voltage level at the capacitor drops below the threshold voltage. Therefore, the voltage level at the capacitor is used to detect whether the input clock signal is operating correctly. It will be understood by a person skilled in the art that an arrangement can be made that allows the storage element to charge during the first time slot and to discharge during the second time slot.

At step 1006, a control signal is generated based on the voltage level at the capacitor. In an embodiment of the present invention, the control signal of a HIGH logic level is generated when the voltage level at the capacitor is greater than the threshold voltage and of a LOW logic level is generated when the voltage level at the capacitor is less than the threshold voltage.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A clock monitor system for monitoring an input clock signal to an integrated circuit(IC), wherein the input clock signal switches alternatively between a first logic level and a second logic level, the clock monitor system comprising:
   a clock failure detection circuit that generates a control signal based on an input clock signal switching; and
   a delay circuit connected to the clock failure detection circuit that provides a clock status signal to the IC based on the control signal after a pre-determined number of input clock cycles, wherein the clock status signal indicates a failure of the input clock signal; and
   wherein the clock failure detection circuit comprises:
   a plurality of transistors that monitor the input clock signal, wherein at least one of the plurality of transistors is in an OFF state during a first time slot, and wherein each of the plurality of transistors is in an ON state during a second time slot;

an energy storage element connected to the plurality of transistors that charges during the second time slot and discharges during the first time slot; and an output circuit connected to the energy storage element that generates the control signal based on a voltage level of the energy storage element, wherein the control signal is provided as an input to the delay circuit.

2. The clock monitor system for monitoring the input clock signal of claim 1, wherein the storage element comprises a capacitor.

3. The clock monitor system for monitoring the input clock signal of claim 1, wherein the clock failure detection circuit further comprises:

one or more discharge paths connected in parallel to the energy storage element, wherein the one or more discharge path discharge the storage element during the first time slot, and wherein a discharge path of the one or more discharge path is selected based on a frequency range of the input clock signal; and one or more delay elements connected to the plurality of transistors that apply a distinct phase shifted input clock signal to at least one of the plurality of transistors.

4. The clock monitor system for monitoring the input clock signal of claim 3, wherein each of the one or more discharge paths comprises one or more transistors.

5. The clock monitor system for monitoring the input clock signal of claim 3, wherein each of the one or more discharge paths comprises one or more resistors.

6. The clock monitor system for monitoring the input clock signal of claim 3, wherein the output circuit changes the control signal when the voltage level of the storage element exceeds a threshold voltage.

7. The clock monitor system for monitoring the input clock signal of claim 3, wherein the delay circuit comprises one or more flip-flops.

8. The clock monitor system for monitoring the input clock signal of claim 7, wherein the predetermined number of input clock cycles depends on a number of flip-flops of the one or more flip-flops.

9. A method for monitoring an input clock signal to an Integrated Circuit (IC), wherein the input clock signal switches alternatively between a first logic level and a second logic level, the method comprising the steps of:

generating a control signal based on an input clock signal switching to detect a failure of the input clock signal; and providing a clock status signal to the IC based on the control signal after a predefined number of input clock cycles, wherein the clock status signal indicates the failure of the input clock signal to the IC; and wherein the step of generating the control signal comprises:

switching at least one of a plurality of transistors to an OFF state during a first time slot and switching each of the plurality of transistors to an ON state during a second time slot based on the input clock signal switching;

charging an energy storage element during the second time slot and discharging the energy storage element during the first time slot; and generating the control signal based on a voltage level of the energy storage element, wherein the control signal is used to generate the clock status signal.

10. The method for monitoring the input clock signal of claim 9, wherein the storage element comprises a capacitor.

11. The method for monitoring the input clock signal of claim 9, wherein the step of providing the clock status signal comprises the step of:

providing the clock status signal as an output of one or more flip-flops that are responsive to the input clock signal, wherein the predefined input clock cycle depends on a number of flip-flops of the one or more flip-flops.

* * * * *